US008514027B2

(12) United States Patent
Baik et al.

(10) Patent No.: US 8,514,027 B2

(45) Date of Patent: Aug. 20, 2013

(54) METHOD OF MULTI-STAGE SUBSTRATE ETCHING AND TERAHERTZ OSCILLATOR MANUFACTURED USING THE SAME METHOD

(75) Inventors: Chan Wook Baik, Seongnam-si (KR); Jong Seok Kim, Hwaseong-si (KR); Seong Chan Jun, Seoul (KR); Sun Il Kim, Seoul (KR); Jong Min Kim, Suwon-si (KR); Chan Bong Jun, Seoul (KR); Sang Hun Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/306,146

(22) Filed: Nov. 29, 2011

(65) Prior Publication Data

US 2012/0133450 A1 May 31, 2012

Related U.S. Application Data

(62) Division of application No. 12/025,186, filed on Feb. 4, 2008, now Pat. No. 8,092,702.

(30) Foreign Application Priority Data

Jul. 25, 2007 (KR) ........................ 10-2007-0074593

(51) Int. Cl.
*H03B 5/30* (2006.01)
*B44C 1/22* (2006.01)

(52) U.S. Cl.
USPC .................... 331/96; 216/33; 216/41; 216/58; 216/83; 331/154; 428/195.1; 438/455

(58) Field of Classification Search
USPC .................. 331/96, 154; 428/195.1; 216/33, 216/41, 58, 83; 438/455
See application file for complete search history.

(56) References Cited

U.S. PATENT DOCUMENTS

| | | | | |
|---|---|---|---|---|
| 6,544,863 | B1 | 4/2003 | Chong et al. | |
| 6,967,145 | B2 * | 11/2005 | Tseng et al. | 438/401 |
| 2003/0031939 | A1 | 2/2003 | Butschke et al. | |
| 2004/0104198 | A1 | 6/2004 | Chen et al. | |
| 2006/0207087 | A1 | 9/2006 | Jafri et al. | |
| 2007/0012653 | A1 * | 1/2007 | Nasiri et al. | 216/2 |
| 2009/0120903 | A1 | 5/2009 | Baik et al. | |

FOREIGN PATENT DOCUMENTS

KR 1020040086679 10/2004

* cited by examiner

*Primary Examiner* — Shamim Ahmed
(74) *Attorney, Agent, or Firm* — Cantor Colburn LLP

(57) ABSTRACT

A method of multi-stage substrate etching and a terahertz oscillator manufactured by using the method are provided. The method comprises the steps of forming a first mask pattern on any one surface of a first substrate, forming a hole by etching the first substrate using the first mask pattern as an etching mask, bonding, to the first substrate, a second substrate having the same thickness as a depth to be etched, forming a second mask pattern on the second substrate bonded, forming a hole by etching the second substrate using the second mask pattern as an etching mask, and removing an oxide layer having the etching selectivity between the first substrate and the second substrate.

2 Claims, 6 Drawing Sheets

METHOD OF MULTI-STAGE SUBSTRATE ETCHING AND TERAHERTZ OSCILLATOR MANUFACTURED USING THE SAME METHOD

This application is a divisional application of U.S. patent application Ser. No. 12/025,186 filed on Feb. 4, 2008, now issued as U.S. Pat. No. 8,092,702, which claims priority to Korean Patent Application No. 10-2007-0074593 filed on Jul. 25, 2007 in the Korean Intellectual Property Office, and all the benefits accruing therefrom under 35 U.S.C. §119, the contents of which are incorporated herein in their entirety by reference.

BACKGROUND OF THE INVENTION

1. Field of the Invention

The present invention relates to a method of multi-stage substrate etching and a terahertz oscillator manufactured using the same method, and more particularly to a method of multi-stage substrate etching which prevents a height deviation of an etching surface even in a deep step height, the curvature of an etching edge, and a T-shape of an etching wall face to thereby improve the etching quality, and a terahertz oscillator manufactured using the same method.

2. Description of the Prior Art

A terahertz bandwidth is very important in context with applications in molecular spectroscopy, biophysics, medicine, spectroscopy, video and security. Despite of its importance, it is true that the terahertz bandwidth ($10^{12}$ Hz) ranged between the existing bandwidth of microwave and the optical frequency has almost no currently developed appliance, such as an oscillator or an amplifier, due to its mechanical, engineering limitation.

However, with the recent development in various new concepts and technology of micro machining, such an appliance has been actively developed. Together with the effort for increasing the frequency of the various oscillators in existing microwave bandwidth, many approaches have been tried to reduce the operating frequency to the terahertz bandwidth using an optical device such as semiconductor laser or femtosecond laser. Recently, many attempts have been proposed to provide a miniaturized terahertz radiation source.

Among them for providing a terahertz oscillator, it has been proposed a method of forming a 3-dimensional microstructure by providing a substrate with a plurality of steps using the MEMS technology. In particular, in order to form a plurality of steps in a substrate such as a silicon wafer, there is technology in which a plurality of mask patterns are deposited in series on the substrate, and the mask patterns are repeatedly removed through etching, thereby forming various step structures.

Meanwhile, there is another technology using the bonding of a wafer in which a protection layer is previously patterned to a first wafer, the first wafer is bonded to a second wafer, the second wafer is patterned and etched on its upper surface, and then the first wafer is etched in turn using the patterned protection layer.

SUMMARY OF THE INVENTION

Accordingly, the present invention has been made to solve the problems occurring in the prior art, and an object of the present invention is to provide a method of multi-stage substrate etching which prevents a height deviation of an etching surface even in a deep step height, the curvature of an etching edge, and a T-shape of an etching wall face to thereby improve the etching quality.

Another object of the present invention is to provide a terahertz oscillator manufactured using the above method.

In order to accomplish the first object of the present invention, there is provided a method of multi-stage substrate etching comprising the steps of: forming a first mask pattern on any one surface of a first substrate; forming a hole by etching the first substrate using the first mask pattern as an etching mask; bonding, to the first substrate, a second substrate having the same thickness as a depth to be etched; forming a second mask pattern on the second substrate bonded; forming a hole by etching the second substrate using the second mask pattern as an etching mask; and removing an oxide layer having the etching selectivity between the first substrate and the second substrate.

In order to accomplish the second object of the present invention, there is provided a terahertz oscillator having the construction comprising two or more structures bonded to each other manufactured by a method of multi-stage substrate etching, the method comprising the steps of: forming a hole by etching a first substrate using, as an etching mask, a first mask pattern formed on any one surface of the first substrate; bonding, to the first substrate, a second substrate having the same thickness as a depth to be etched; forming a second mask pattern on the second substrate bonded; forming a hole by etching the second substrate using the second mask pattern as an etching mask; and removing an oxide layer having the etching selectivity between the first substrate and the second substrate.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

The present invention provides the process using substrate alignment using a backside process, an etch stop layer using a silicon oxide, and silicon double bonding.

Hereinafter, exemplary embodiments of the present invention will be described with reference to the accompanying drawings. The present invention, however, is not limited to the embodiments below, but may be changed in diverse forms.

FIGS. 1A to 1F illustrate a method of multi-stage substrate etching according to an embodiment of the present invention.

According to an embodiment of the present invention, in order to solve many problems occurring upon the multi-stage etching, a masking layer such as an oxide layer is firstly formed on a substrate, and another masking layer having the etching selectivity to the former masking layer is then adapted thereto. For example, another masking layer may be provided by photoresist coating (PR coating).

Figure 1A:
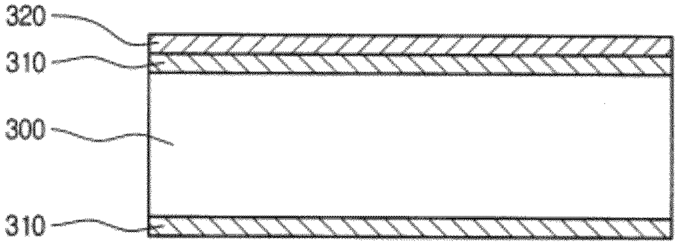
FIGS. 1A to 1F illustrate a method of multi-stage substrate etching according to an embodiment of the present invention.
Figure 1B:
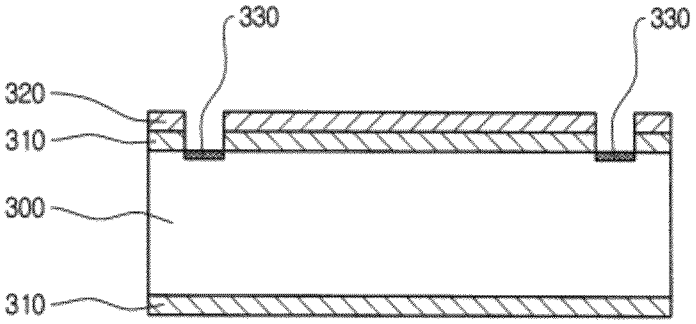
Figure 1C:
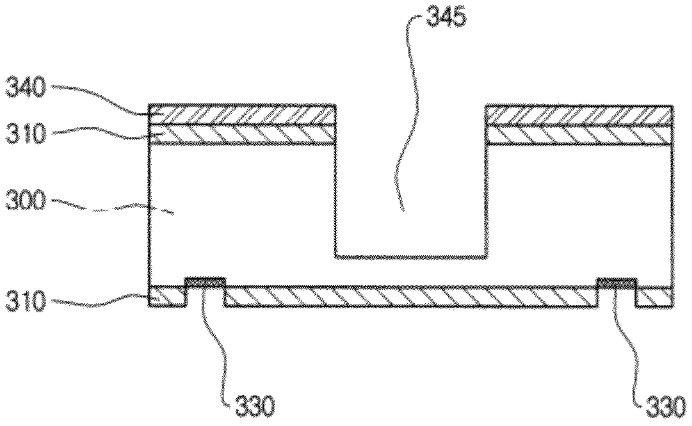
Figure 1D:
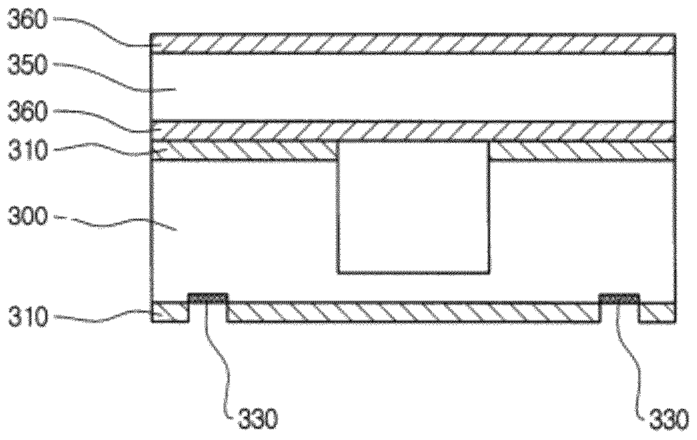
Figure 1E:
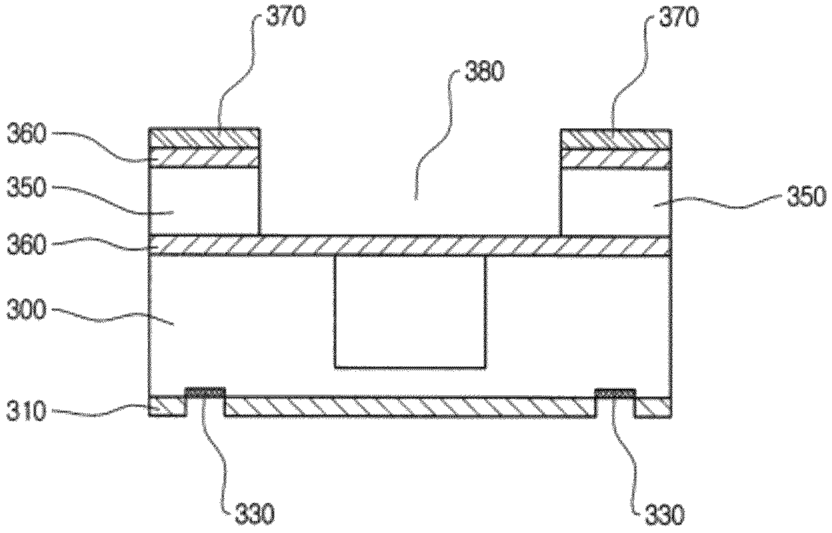
Figure 1F:
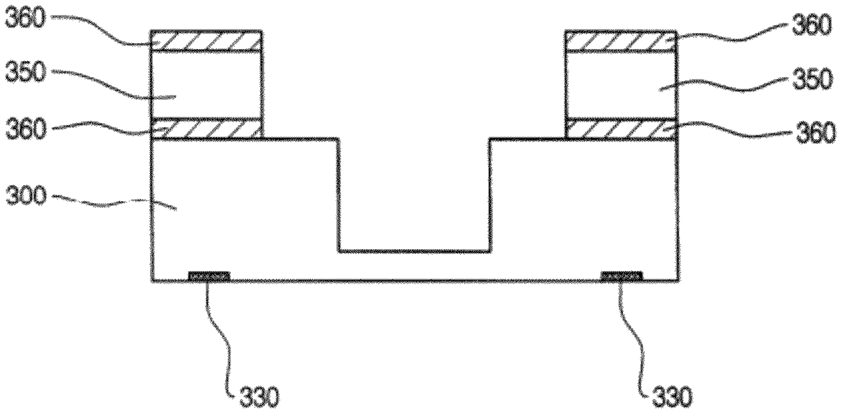

The multi-stage etching method according an embodiment of to the present invention includes the step of performing PR coating 320 onto any one surface of a substrate 300 applied with an oxide layer 310 as shown in FIG. 1A, the step of generating an alignment key pattern 330 as shown in FIG. 1B, the step of forming a desired pattern 340 on the other side of the substrate and etching it to a desired depth as shown in FIG. 1C, the step of wafer-bonding a new substrate to the substrate of FIG. 1C as shown in FIG. 1D, the step of patterning 370 the upper portion of the bonded substrate and etching it as shown in FIG. 1E, and the step of removing oxide layers 310 and 360 exposed to outside remaining only the upper layer 360 as shown in FIG. 1F.

FIG. 1A illustrates the substrate 300 having the oxide layer 310 and the PR coating 320.

The oxide layer 310 is formed by depositing oxide or thermal annealing on the first substrate 300, and the PR is coated on any surface of the oxide layer 310 of the first substrate 300.

FIG. 1B illustrates the substrate on which the alignment key pattern 330 is formed.

The substrate having the alignment key pattern 330 is formed by providing the alignment key pattern on the surface of the substrate on which the PR coating is provided.

FIG. 1C illustrates the etched substrate.

The etched substrate is formed by providing, on the other surface of the first substrate 300 on which the alignment key pattern is not formed (the opposite surface to the PR coating), with a desired pattern, i.e., a first mask pattern 340, and etching the first substrate 300 using the first mask pattern 340 as an etching mask to thereby form a hole 345. Meanwhile, when the substrate of FIG. 1C is formed from the substrate of FIG. 1B, a process of removing the PR coating formed in FIG. 1A may be performed.

FIG. 1D illustrates the state where the substrate of FIG. 1C and a newly provided substrate are bonded to each other.

Such a bonding process is carried out by a wafer-bonding between the etched substrate of FIG. 1C and the newly provided substrate 350 using like a Si direct bonding.

The newly provided substrate is for secondary etching. Herein, the newly provided substrate, i.e., a second substrate 350, has the same thickness as an etching depth according to an embodiment of the present invention. For bonding with the etched substrate of FIG. 1C, the second substrate 350 is prepared to have a desired thickness using lapping or polishing, and the oxide layer 360 is formed thereon. Meanwhile, when the first substrate 300 of FIG. 1D is formed from the substrate of FIG. 1C, a process of removing the PR coating 340 formed in FIG. 1C may be performed.

When the second substrate 350 is bonded to the first substrate 300, the second mask pattern 370 is formed on the second substrate 350 for secondary etching.

FIG. 1E illustrates the substrate that is etched using the second mask pattern 370 as an etching mask.

The etched substrate formed by using the second mask pattern 370 is formed by providing the second mask pattern 370 on the second substrate 350, and etching the second substrate 350 using the second mask pattern 370 as an etching mask to thereby form the hole 380.

FIG. 1F illustrates a step structure formed according to an embodiment of the present invention.

The step structure of FIG. 1F is formed by removing the oxide layer 360. The removing process of the oxide layer 360 having the etching selectivity between the first substrate 300 and the second substrate 350 may be carried out by wet etching. The wet etching is an etching method using a solution, wherein generally, only a selected area is accurately etched with photoresist and a developer solution by using a photolithography. Meanwhile, a process of removing the PR coating 370 formed in FIG. 1E may be performed.

Figure 1G:
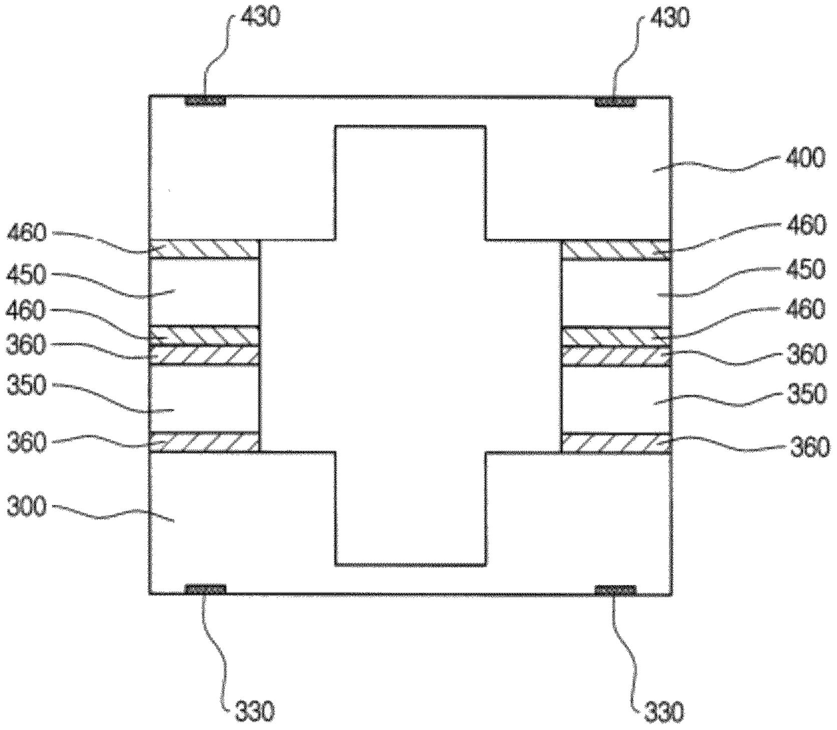
FIG. 1G illustrates a terahertz oscillator manufactured by the method of multi-stage substrate etching according to an embodiment of the present invention.

FIG. 1G illustrates a terahertz oscillator manufactured by using the multi-stage substrate etching method according to an embodiment of the present invention.

The oscillator of FIG. 1G is manufactured by bonding two or more structures formed by the multi-stage etching method. The method, as illustrated in FIGS. 1A to 1F, includes the steps of forming the first mask pattern on any one surface of the first substrate 300, forming the hole by etching the first substrate 300 using the first mask pattern as an etching mask, bonding, to the first substrate, the second substrate 350 having the same thickness as a depth to be etched, forming the second mask pattern on the second substrate bonded, forming the hole by etching the second substrate using the second mask pattern as an etching mask, and removing the oxide layer 360 having the etching selectivity between the first substrate and the second substrate. The structures 400, 430, 450, and 460 bonded to the upper portion are also formed by the processes shown in FIGS. 1A to 1F. Herein, the bonding process between the two or more structures may be conducted such that the holes formed in the structures are shared with each other. At this time, for accurate bonding, the structures may be aligned using the alignment key patterns 330, 430 formed in FIG. 1B. In this manner, according to an embodiment of the present invention, three or more structures may be bonded to each other, and the number of steps may increased using a plurality of substrates such as a third substrate, a fourth substrate, etc., so that diverse types of 3-dimensional structure may be obtained.

Figure 2A:
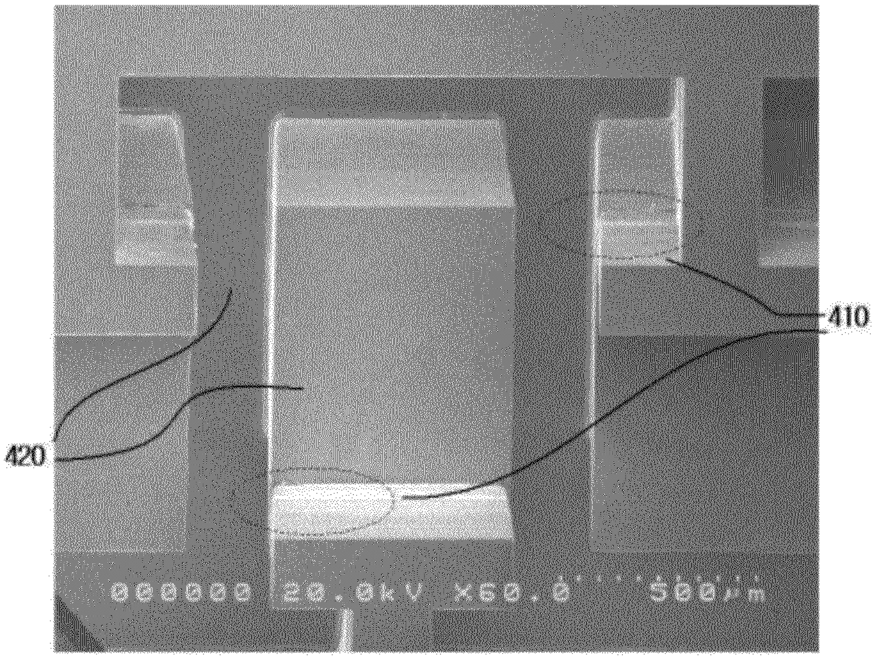
FIGS. 2A to 2C illustrate the exemplary implementations realized by the method of multi-stage substrate etching according to an embodiment of the present invention.
Figure 2B:
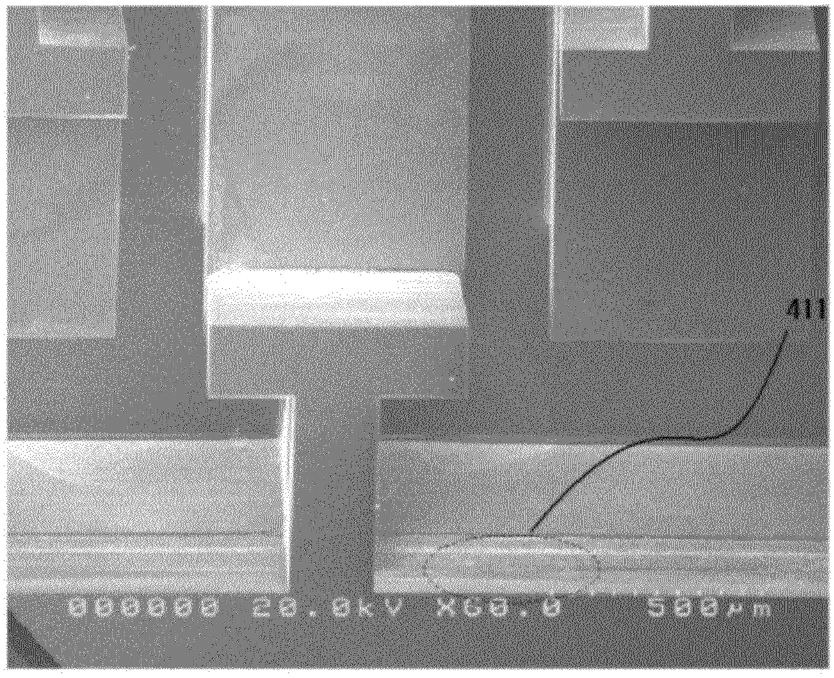
Figure 2C:
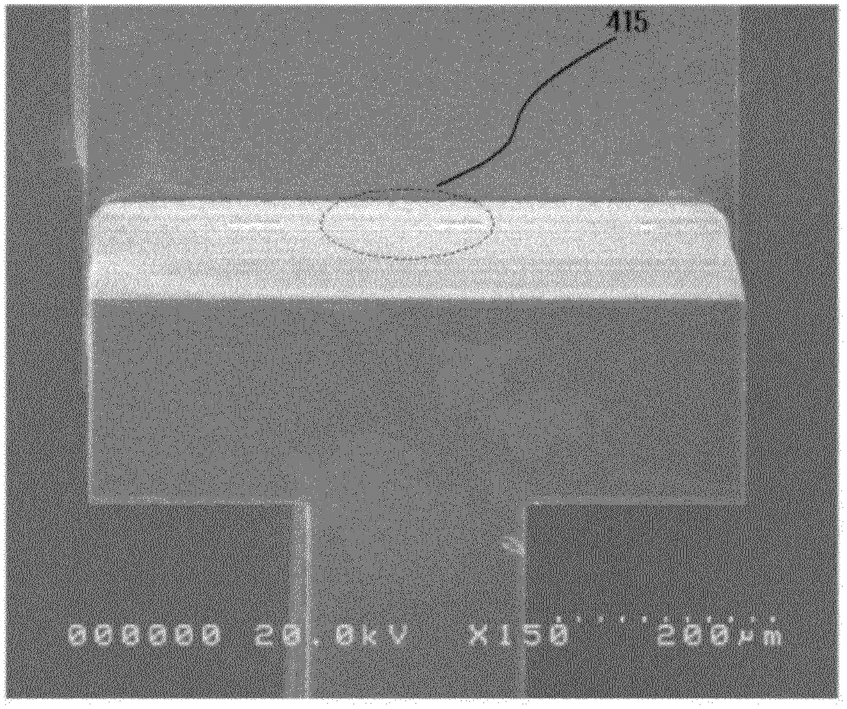

FIGS. 2A to 2C illustrate the exemplary implementations realized by the method of multi-stage substrate etching according to an embodiment of the present invention.

In FIGS. 2A and 2B, reference numerals 410 and 411 indicate bonding positions, a reference numeral 420 indicates an etch stop position, which can be known to be a completely flat position. In FIG. 2C, a reference numeral 415 indicates both bonding and etch stop positions, which can be known to be a completely flat position.

Accordingly, it can be known that adapting the present invention to the practice, the curvature or the unevenness of the etched bottom is prevented, and precise bonding is possible.

The present invention may also be applicable to the manufacturing of the terahertz oscillator or amplifier, the 3-dimensional substrate etching, etc.

According to an embodiment of the present invention, the etched bottom surface is made uniformly even in a deep step, the edge curvature is minimized, and a T-shape is prevented from being formed on the etched wall face to thereby improve the etching quality. Further, the etching depth can be previously controlled by lapping or polishing, the upper and lower substrates are precisely bonded to each other using an alignment key, and a multi-layer processing is possibly performed thereto, so that the precision and the uniformity in structure of the oscillator or amplifier is advantageously obtained.

Although an exemplary embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A terahertz oscillator having the construction comprising two or more structures bonded to each other manufactured by a method of multi-stage substrate etching, the method comprising the steps of:

applying an oxide layer onto the first substrate;

performing a photoresist-coating onto any one surface of the first substrate applied with the oxide layer, and forming an alignment key pattern on the photoresist-coated surface;

forming a first mask pattern on a surface of the first substrate that is opposed to the photo-resist coated surface; and forming a hole by etching the first substrate using the first mask pattern as an etching mask;

bonding, to the first substrate, a second substrate having the same thickness as a depth to be etched, the second substrate being bonded to the first substrate on a surface of the first substrate which is opposite the alignment key pattern on the photoresist-coated surface;

forming a second mask pattern on the second substrate bonded;

forming a hole by etching the second substrate using the second mask pattern as an etching mask; and removing an oxide layer having the etching selectivity between the first substrate and the second substrate.

2. The terahertz oscillator according to claim 1, wherein the construction comprising two or more structures bonded to each other is provided such that the two or more structures are aligned by using the alignment key patterns formed on the structures, and bonded to each other by a silicon direct bonding process.

* * * * *